United States Patent
Minami et al.

(10) Patent No.: US 6,517,632 B2
(45) Date of Patent: Feb. 11, 2003

(54) METHOD OF FABRICATING A SINGLE CRYSTAL INGOT AND METHOD OF FABRICATING A SILICON WAFER

(75) Inventors: Toshirou Minami, Niigata (JP); Yumiko Hirano, Niigata (JP); Kouki Ikeuchi, Niigata (JP); Takashi Miyahara, Niigata (JP); Takashi Ishikawa, Niigata (JP); Osamu Kubota, Niigata (JP); Akihiko Kobayashi, Kanagawa (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 0 days.

(21) Appl. No.: 09/760,713

(22) Filed: Jan. 17, 2001

(65) Prior Publication Data

US 2001/0029883 A1 Oct. 18, 2001

(30) Foreign Application Priority Data

Jan. 17, 2000 (JP) .......................... 2000-008007
Mar. 31, 2000 (JP) .......................... 2000-098115

(51) Int. Cl.$^7$ ................................ C30B 25/04
(52) U.S. Cl. .......................... 117/19; 117/20
(58) Field of Search ..................... 117/19, 20

(56) References Cited

U.S. PATENT DOCUMENTS 4,556,448 A * 12/1985 Kim et al. ..................... 117/49
6,059,875 A * 5/2000 Kirkland et al. .............. 117/13

* cited by examiner

*Primary Examiner*—Felisa Hiteshew
(74) *Attorney, Agent, or Firm*—Foley & Lardner

(57) ABSTRACT

A method of fabricating a silicon single crystal ingot and a method of fabricating a silicon wafer using the ingot, characterized in that: the method is structured in such a manner that the silicon single crystal ingot is pulled up from the silicon fused liquid 7 in which nitrogen N and carbon C are doped in polycrystalline silicon, by using the Czochralski method, and its nitrogen density is $1 \times 10^{13} - 5 \times 10^{15}$ atoms/cm$^3$, and the carbon density is $5 \times 10^{15} - 3 \times 10^{16}$ atoms/cm$^3$.

19 Claims, 6 Drawing Sheets

METHOD OF FABRICATING A SINGLE CRYSTAL INGOT AND METHOD OF FABRICATING A SILICON WAFER

BACKGROUND TECHNIQUE

1. Technical Field to which the Invention Belongs

The present invention relates to method of fabricating a silicon single crystal ingot and method of fabricating a silicon wafer, and particularly to a method of fabricating the silicon single crystal ingot by which a yield of a semiconductor device can be increased. Further, particularly the present invention relates to a method of fabricating the silicon wafer by which a crystal defect of a surface layer is decreased, and the BMD density inside the wafer is increased.

2. Description of the Related Art

The silicon wafer used for the semiconductor device is produced in such a manner that the single crystal ingot pulled up from a polycrystalline silicon by the CZ method is sliced.

The CZ method is a method by which polycrystalline silicon as a raw material supplied into a quartz crucible is heated and fused, and a tip of a seed crystal is brought into contact with the silicon fused liquid, and after being got intimate with it, the silicon single crystal ingot is brought up and pulled up.

In order to conduct gettering the impurity such as heavy metals existing on the surface of the crystal of the silicon wafer in thus produced silicon wafer, the IG method (Intrinsic Gettering)using oxygen precipitate(BMD) is used.

Recently, the densification of the semiconductor device is advanced, and therewith, the decrease of oxygen is required also for the silicon single crystal ingot. On the one hand, the oxygen deposit in the silicon wafer produced from this silicon single crystal ingot is essential to the IG method, however, the oxygen deposit is decreased due to the decrease of the oxygen.

Accordingly, a method by which nitrogen is doped in the polycrystalline silicon fused liquid, and the deposit of oxygen is promoted in the crystal of the silicon wafer, is conducted, however, the nitrogen doping generates a ring-like oxide induction lamination layer defect called OSF ring, when the thus produced silicon wafer is subjected to the thermal oxidization processing, and the width of the OSF ring area is increased. Further, inside the OSF ring, the area in which the density of the oxygen deposit is greatly low exists, and in a portion in which the density of the oxygen deposit is greatly low and uneven, the gettering ability is lower than the other portion, and the predetermined gettering ability can not be obtained, and the oxide film with stand voltage is lowered, and the yield of the semiconductor device is lowered.

Further, the electric characteristic, especially, the aging dielectric breakdown characteristic of the oxide film is lowered, and as a factor to lower the yield of the semiconductor device, there is an etch pit generated after the etching of the silicon wafer.

That is, in the semiconductor device production process, as a cause to lower the yield, the existence of COP (Crystal Originated Particle) is listed (refer to FIG. 5), and this COP is one of the crystal defects introduced at the time of the crystal growing, and is a cavity type defect of the regular octahedron. This COP forms a pit on the surface of the silicon wafer when the silicon wafer after the specular polishing is etched by a mixed liquid of ammonium and hydrogen peroxide (etch pit, refer to FIG. 7), and deteriorates the aging dielectric breakdown characteristic of the oxide film of the silicon wafer, and further, is a factor of the lowering of the yield in the semiconductor device production process.

As a method to suppress the etch pit density, in order to suppress the introduction of the COP in the single crystal growing process which is the cause of the etch pit generation, the lowering of the pulling up speed of the single crystal is conducted. However, in this single crystal pulling up method, the productivity is lowered and the practicability is poor.

Further, as another method, in JP-A-3-193698, a method by which oxygen, nitrogen, and D defect are contained in the silicon wafer sliced from the silicon ingot produced by FZ method, and when it is heat-treated, even when an amount of oxygen is comparatively small and even under the existence of nitrogen, the heavy metal can be gettered, is disclosed.

However, this disclosed method is the FZ method, and there is no countermeasure for the defect existing in the surface layer (depth of several $\mu$m from the surface).

Further, in JP-A-5-294780, a method by which nitrogen is doped in the polycrystalline silicon fused liquid, is disclosed, and, in the nitrogen doping, it is disclosed that Secco-etch pit is not above 300 pits/cm$^2$, however, in the same way as in the above, there is no countermeasure for the defect existing in the surface layer which influences the yield of the semiconductor device.

Further, in JP-A-11-195565, a method to produce the silicon wafer in which nitrogen is doped in the polycrystalline silicon; the single crystal is pulled up at low speed by using the Czochralski method; the nitrogen density is controlled; and the OSF ring is generated in the inside from the outer periphery of the crystal, or vanished at the central portion, is disclosed, however, the method is a method in which the single crystal is pulled up at the low speed, and the productivity is low and the practicability is poor.

Further, in order to reduce COP which is a cause of the etch pit, it is also effective to anneal the silicon wafer in the hydrogen atmosphere at the high temperature, and many methods are proposed.

For example, as disclosed in JP-A-11-186277, it is a method in which the pulling up speed of single crystal in the CZ method is increased, and the silicon wafer in which the COP size is 60–130 nm, is heat-treated in the reduction atmosphere. However, the hydrogen annealing is effective as a method to vanish the COP existing on the silicon wafer surface, and the COP decreasing effect of the surface is recognized to be conspicuous, however, a considerable numbers of COPs remain on the surface, and in the surface layer of about 5 $\mu$m depth from the surface which largely influences on the yield of the semiconductor device, the COP remains. Further, only by the size reduction of the COP by the increase of the pulling up speed (higher than 0.6 mm/min) disclosed in the official specification, the vanishing of the surface layer COP can not also be attained.

Further, in JP-A-11-135514, a method by which the silicon wafer having the COP density of not larger than 0.16 pits/cm$^2$, is produced by the heat treatment in the mixture atmosphere of hydrogen and argon, is disclosed, however, in order to vanish the COP existing in the surface layer of about 5 $\mu$m depth from the surface by the hydrogen annealing, it is necessary to make the silicon single crystal controlled in the shape in which the COP before the annealing is easily vanished. However, there is no consideration about which shape silicon single crystal is preferable.

Further, as a factor by which the oxide film withstand voltage or the aging dielectric breakdown characteristic of the oxide film is decreased, and the yield of the semiconductor device is decreased, other than the COP (Crystal Originated Particle) existing as the Grown-in defect in the silicon single crystal ingot pulled up by the CZ method, LSTD (Laser Scattering tomography defect), and FPD (Flow Pattern Defect) are considered.

That is, this COP is, as described above, considered as an aggregate of holes (transition loop or regular octahedron void (void defect)), and when the silicon wafer after the specular polishing is etched by the mixed liquid of ammonium and hydrogen peroxide, this COP forms the pit on the surface of the silicon wafer (etch pit), and deteriorates the oxide film withstand voltage or the aging dielectric breakdown characteristic of the oxide film of the silicon wafer, and becomes a factor of the decreasing of yield in the semiconductor device production process.

Further, as the result of the advance of the temperature lowering of the process of the semiconductor device, the COP of 0.1–0.2 $\mu$m level is hardly vanished in the process, and deteriorates the oxide film withstand voltage or the aging dielectric breakdown characteristic of the oxide film of the silicon wafer.

Further, the LSTD is considered as the oxygen deposit or an octahedron void including the oxygen deposit, and detected by the IR laser scattering tomography, and further, the FPD is a pit accompanied by the flow pattern appearing in the Secco-etching, and these deteriorate the oxide film withstand voltage or the aging dielectric breakdown characteristic of the oxide film of the silicon wafer.

Conventionally, as a pulling-up method of the silicon single crystal ingot to decrease the crystal defect, many methods are proposed.

For example, in a pulling-up method of the silicon single crystal ingot written in JP-A-3-193698, a method, by which the silicon single crystal ingot is produced by the FZ method in the nitrogen atmosphere, and further, oxygen, nitrogen and D defect are contained in the silicon wafer sliced from the silicon ingot, and when this is heat-treated, even when an amount of oxygen is comparatively small, or even under the existence of nitrogen, the heavy metal can be captured, is disclosed. However, in this disclosed method, there is no countermeasure against the defect existing in the surface layer (depth of several pm from the surface).

Further, in JP-A-5-294780, a method by which nitrogen is doped in the silicon fused liquid, is conducted, and it is disclosed that the Secco-etch pit is not larger than 300 pits/cm$^2$ by the nitrogen doping, however, in the same manner as in the above, there is no countermeasure against the defect existing in the surface layer, which influences the yield of the semiconductor device.

Accordingly, a silicon single crystal ingot by which the oxide film withstand voltage characteristic and the aging dielectric breakdown characteristic of the oxide film of the semiconductor device are increased, and the yield of the semiconductor device can be increased, and which can be pulled up at high speed, and its production method and the production method of a silicon wafer, are required.

SUMMARY OF THE INVENTION

In view of the above conditions, the present invention is attained, and an object of the present invention is to provide a silicon single crystal ingot by which the oxide film withstand voltage characteristic and the aging dielectric breakdown characteristic of the oxide film of the semiconductor device are increased, and the yield of the semiconductor device can be increased, and which can be pulled up at high speed, and its production method and the production method of a silicon wafer.

The object of the invention of the first aspect to attain the above object is the method of fabricating the silicon single crystal ingot characterized in that, in the method of fabricating a silicon single crystal ingot by using the Czochralski method, the nitrogen density of the silicon single crystal pulled up from the silicon fused liquid in which nitrogen and carbon are doped in polycrystalline silicon, is $1 \times 10^{13} – 5 \times 10^{15}$ atoms/cm$^3$, and the carbon density is $5 \times 10^{15} – 3 \times 10^{16}$ atoms/cm$^3$.

The object of the invention of the second aspect of the present invention is the method of fabricating the silicon single crystal ingot according to the first aspect, wherein the carbon doping is conducted by placing a carbon plate above the silicon fused liquid and fusing.

The object of the invention of the third aspect of the present invention is the method of fabricating a silicon wafer, characterized in that, from the silicon fused liquid in which nitrogen and carbon are doped in the polycrystalline silicon, by using the Czochralski method, the silicon single crystal ingot having the nitrogen density of $1 \times 10^{13} – 5 \times 10^{15}$ atoms/cm$^3$ and carbon density of $5 \times 10^{15} – 3 \times 10^{16}$ atoms/cm$^3$ is pulled up, and the pulled up silicon single crystal ingot is sliced, and the silicon wafer is produced, and further heat-treated, and the crystal defect having the gettering effect is formed inside it.

The object of the invention of the fourth aspect of the present invention is the method of fabricating the silicon wafer, characterized in that the silicon single crystal ingot pulled up from the silicon fused liquid in which nitrogen or carbon, or both of nitrogen and carbon are doped in the polycrystalline silicon, by using the Czochralski method, is sliced, and the silicon wafer is produced, and after that, the silicon wafer is polished and a specular polished wafer is produced, and after the specular polished wafer is etched by using the etching solution, the density of the etch pit not below 0.11 $\mu$m, created on the surface of the specular polished wafer, is not larger than 2 pits/cm$^2$, and the maximum size of the etch pit is not larger than 0.15 $\mu$m.

The object of the invention of the fifth aspect of the present invention is the method of fabricating the silicon wafer according to the fourth aspect, wherein the silicon wafer is produced in such a manner that the silicon single crystal ingot which is pulled up from the silicon fused liquid in which nitrogen and carbon are doped in the polycrystalline silicon, by using the Czochralski method, and which has the nitrogen density of $1 \times 10^{13} – 5 \times 10^{15}$ atoms/cm$^3$ and carbon density of $5 \times 10^{15} – 3 \times 10^{16}$ atoms/cm$^3$, is sliced.

The object of the invention of the sixth aspect of the present invention is the method of fabricating the silicon wafer according to the fourth aspect or the fifth aspect, wherein the production method includes the process to heat-treat the etched silicon wafer in the high temperature hydrogen atmosphere.

The object of the invention of the seventh aspect of the present invention is the method of fabricating the silicon wafer according to the fourth aspect or the fifth aspect, wherein, in the etching, the composition of the etching solution is a ratio of ammonium 1: hydrogen peroxide 2: water 13, and the temperature of the liquid is 60–70° C., and the etching time is 10–30 minutes.

The object of the invention of the eighth aspect of the present invention is the method of fabricating a silicon wafer, characterized in that the silicon single crystal ingot pulled up from the silicon fused liquid in which nitrogen is doped, by using the Czochralski method, is sliced, and the silicon wafer is produced, and the silicon wafer is hydrogen-annealed, and the crystal defect in the surface layer is decreased, and the BMD density inside the wafer is increased.

The object of the invention of the ninth aspect of the present invention is the method of fabricating the silicon wafer according to the eighth aspect, wherein the nitrogen density contained in the crystal of the silicon wafer is $1\times10^{13}$–$5.0\times10^{15}$ atoms/cm$^3$, and the oxygen density is $0.7\times10^{18}$–$1.4\times10^{18}$ atoms/cm$^3$.

The object of the invention of the tenth aspect of the present invention is the method of fabricating the silicon wafer according to the eighth aspect or the ninth aspect, wherein the hydrogen-annealing is conducted in the temperature range of 1000–1400° C. for not shorter than 10 minutes.

The object of the invention of the eleventh aspect of the present invention is the method of fabricating the silicon wafer according to any one of the eighth aspect to the tenth aspect, wherein the COP of the surface layer of 0.2 μm of the hydrogen-annealed silicon wafer is not larger than 3 pieces per wafer.

The object of the invention of the twelfth aspect of the present invention is the method of fabricating the silicon wafer according to any one of the eighth aspect to the eleventh aspect, wherein the LSTD density having the dimension of not below 70 nm is not larger than 3 pieces/cm2 in the area of the surface layer of 0 to 5 μm of the hydrogen-annealed silicon wafer, and the BMD not below the dimension of 70 nm exists in the high density in the area not below 10 μm.

The object of the invention of the thirteenth aspect of the present invention is the method of fabricating the silicon wafer according to the eleventh aspect or the twelfth aspect, wherein the BMD density of the hydrogen-annealed silicon wafer is not below $0.5\times10^5$/cm$^2$.

The object of the invention of the fourteenth aspect of the present invention is the method of fabricating the silicon wafer, characterized in that the silicon single crystal ingot pulled up from the silicon fused liquid in which nitrogen is doped, by using the Czochralski method, is sliced, and the silicon wafer is produced, and the nitrogen density of the silicon wafer is $6\times10^{13}$–$2\times10^{15}$ atoms/cm$^3$, and the oxygen density is $0.8\times10^{18}$–$1.2\times10^{18}$ atoms/cm$^3$.

The object of the invention of the fifteenth aspect of the present invention is the method of fabricating the silicon wafer according to the fourteenth aspect, wherein the production method includes a process in which the silicon wafer is heat-treated in the atmosphere of H2, Ar, N2, or an inert gas, reduction gas, or their mixed gas, at not lower than 1100° C., for not shorter than 1 minute, and the LSTD density up to the surface layer of 5 μm is not larger than 1 piece/cm$^2$, and the BMD density in the area of the depth of not lower than 10 μm is not below $7\times10^4$ pieces/cm$^2$.

The object of the invention of the sixteenth aspect of the present invention is the method of fabricating the silicon wafer according to the fifteenth aspect, wherein the gas atmosphere is the hydrogen atmosphere.

DESCRIPTION OF THE REFERENCE NUMERALS AND SIGNS

[Mode for Carrying Out the Invention]

Referring to attached drawings, embodiments of a silicon single crystal ingot, its production method and the method of fabricating a silicon wafer according to the present invention will be described below.

Figure 1:
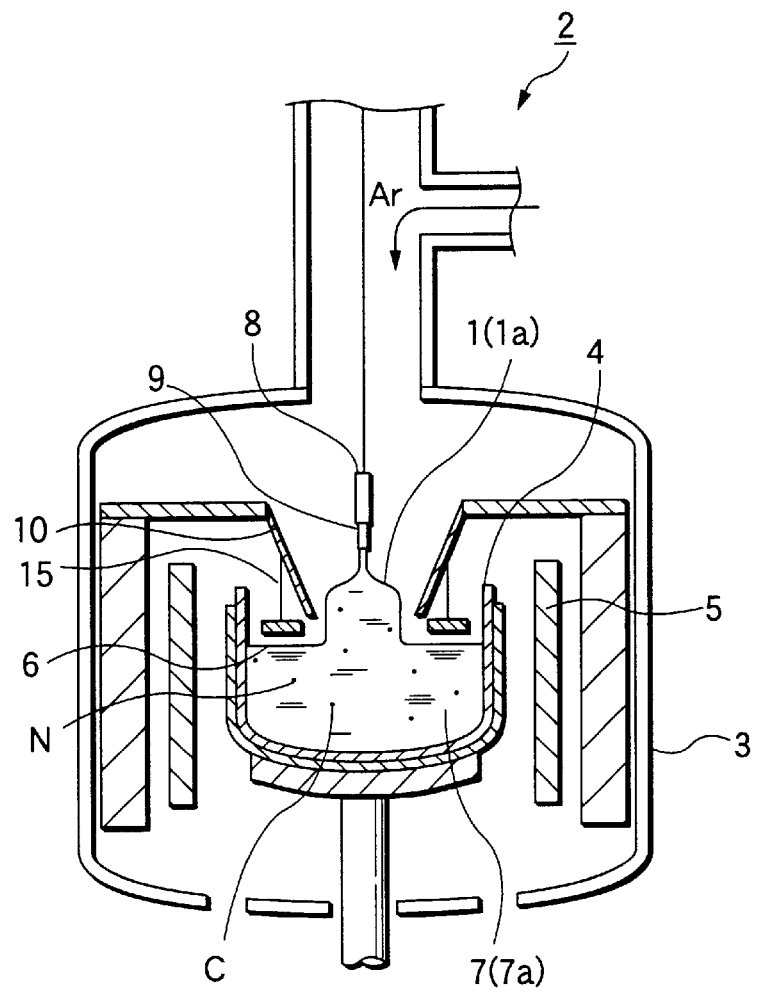
FIG. 1 is a schematic longitudinal sectional view of a single crystal pulling up apparatus used for the pulling-up of a silicon single crystal ingot according to the present invention.

FIG. 1 is a silicon single crystal pulling up apparatus 2 for producing the silicon single crystal ingot 1 according to the present invention, and the silicon single crystal ingot 1 pulled up by the silicon single crystal pulling up apparatus 2 is grown by doping nitrogen and carbon in polycrystalline silicon, by using the Czochralski method, and the nitrogen density of the pulled up silicon single crystal ingot 1 is $1\times10^{13}$–$5\times10^{15}$ atoms/cm$^3$, and the carbon density is $5\times10^{15}$–$3\times10^{16}$ atoms/cm$^3$.

When the nitrogen density is not higher than $1\times10^{13}$ atoms/cm$^3$, the gettering effect can not be fully exhibited, and when the nitrogen density exceeds $5\times10^{15}$ atoms/cm$^3$, the transferring of the silicon single crystal easily occurs and further, when the silicon wafer produced from the silicon single crystal ingot is subjected to the thermal oxidation processing, the generation of OSF ring becomes considerable.

When the carbon density is not higher than $5\times10^{15}$ atoms/cm$^3$, the effect of the oxygen deposit acceleration can not be expected, and when it exceeds $10^{15}$–$3\times10^{16}$ atoms/cm$^3$, the oxygen deposit amount is too much and gives the bad influence to the semiconductor device characteristic.

Next, the method of fabricating the silicon single crystal ingot 1 according to the present invention will be described.

As shown in FIG. 1, in a CZ method used for the method of fabricating the silicon single crystal ingot according to the present invention, polycrystalline silicon which is a raw material, is filled in a quartz glass crucible 4 arranged in a chamber 3 of a single crystal pulling up apparatus 2, and further, as a dopant to dope nitrogen N, a predetermined amount of silicon nitride is supplied so that the pulled up silicon single crystal ingot 1 has the above nitrogen density, and the polycrystalline silicon is heated and fused by a heater 5 provided on the outer periphery of the quartz glass crucible 4. Then, a high purity carbon plate 6 having a predetermined dimension is suspended through a wire 15 such as tungsten from a radiation shield 10 arranged above the quartz glass crucible 4, and the high purity carbon plate 6 is arranged above the silicon fused liquid 7 which is fused at 1410° C., and taken in the silicon fused liquid 7 as silicon carbide, and carbon C is doped. Then, the CZ method is conducted in such a manner that a seed crystal 9 attached onto a seed chuck 8 is dipped in the silicon fused liquid 7 into which the nitrogen and carbon are doped, and the seed chuck 8 is pulled up while the seed chuck 8 and the quartz glass crucible 4 are rotated at a predetermined rotation speed in the same direction or the reversal direction, and the single crystal 1 is grown and pulled up at a predetermined speed. Herein, an example in which the high purity carbon plate 6 is suspended from the radiation shield 10, is shown, but, it may be conducted in such a manner that the high purity carbon plate 6 is suspended from the pulling up apparatus through a wire, and the lifting motor is attached to it, and the carbon plate 6 is moved up and down by the motor. The carbon plate 6 is formed into a flat plate ring shape, and is formed so that its outer periphery is little below the inner periphery of the quartz glass crucible 4, and its inner periphery is formed so as to be a little larger than the bore diameter of the pulled-up silicon single crystal ingot 1, and in the pulling up process, the carbon is taken into the fused liquid.

In this connection, to dope nitrogen at the time of the pulling up of the silicon single crystal is for the purpose that the deposit of oxygen is promoted and as will be described later, the COP size is decreased, and it is considered that, by doping the carbon of the extreme low density, the same effect as the doping of nitrogen can be obtained, and further, when nitrogen and carbon are simultaneously doped, by the synergetic effect, the high density oxygen deposit can be uniformly deposited in the surface.

In thus pulled up silicon single crystal ingot 1, the nitrogen density is $1\times10^{13}$–$5\times10^{15}$ atoms/cm$^3$, and the carbon density is $5\times10^{15}$–$3\times10^{16}$ atoms/cm$^3$.

Next, the first embodiment of a silicon wafer production method according to the present invention will be described.

Figure 2:
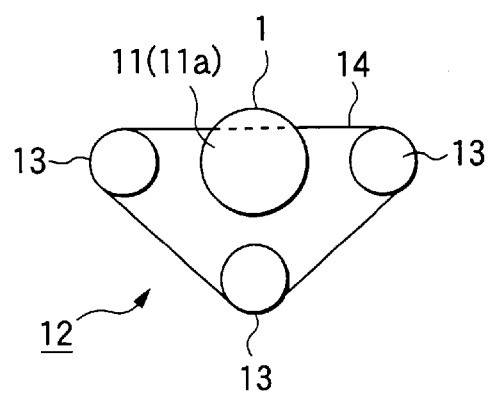
FIG. 2 is a schematic longitudinal sectional view of a wire saw used for the production of a silicon wafer according to the present invention.
Figure 3:
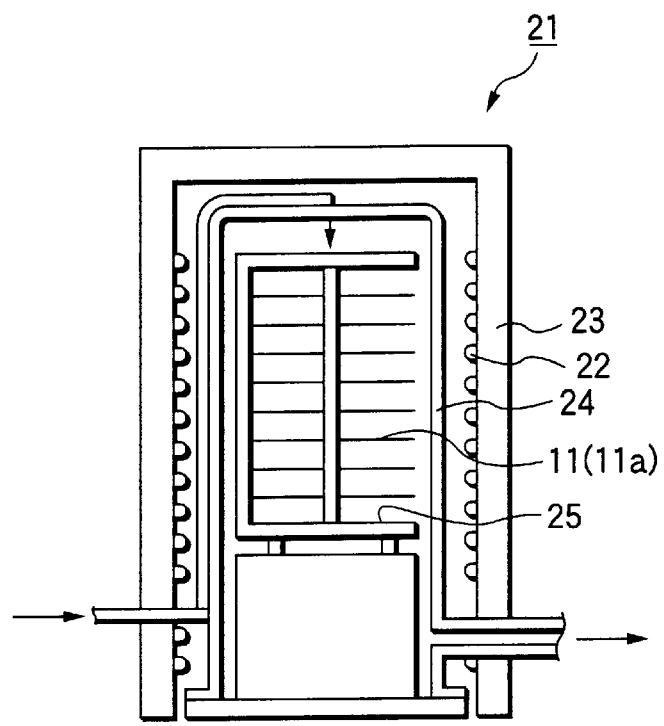
FIG. 3 is a schematic longitudinal sectional view of a heat treatment furnace used for the production of the silicon wafer according to the present invention.

As shown in FIG. 2, in order to produce a silicon wafer 11 according to the present invention, a wire saw 12 is used, and the silicon wafer 11 is produced by slicing into a predetermined thickness by a wire 14 traveling among rotating rollers 13. Thus produced silicon wafer 11 is heat-treated by using a heat treatment furnace 21 as shown in FIG. 3. For example, a wafer boat 25 on which the silicon wafers 11 are loaded, is accommodated in a furnace core tube 24 arranged in the furnace main body 23 having a heater 22, and initially, in the reduction gas atmosphere, it is heat-treated for a predetermined time period at a low temperature range, and next, heat-treated for a predetermined time period at a high temperature range.

In this manner, when the silicon wafer 11 having the nitrogen density of $1\times10^{13}$–$5\times10^{15}$ atoms/cm$^3$ and the carbon density of $5\times10^{15}$–$3\times10^{16}$ atoms/cm$^3$ is heat-treated, the low density area of the BMD density generated inside the OSF ring shape can be improved. That is, the oxygen deposit of density higher than usual is uniformly deposited in the surface, and the effect of the impurity content decreasing of heavy metals by the IG method can be improved.

Accordingly, the silicon wafer by which the oxide film withstand voltage characteristic of the silicon wafer can be increased, and the yield of the semiconductor device can be greatly increased, can be produced.

Next, the second embodiment of the silicon wafer production method according to the present invention will be described. In this connection, the same parts as in the first embodiment of the above silicon wafer production method are denoted by the same reference numerals and signs, and will be described.

By using the single crystal pulling up apparatus 2 as shown in FIG. 1, the polycrystalline silicon which is a raw material, is filled in the quarts glass crucible 4 arranged in a chamber 3 of the single crystal pulling up apparatus 2, and further, from the silicon fused liquid 7a in which nitrogen or carbon, or both of nitrogen and carbon are doped in the polycrystalline silicon, the silicon single crystal ingot 1a is pulled up by using Czochralski method. This silicon single crystal ingot 1a is one into which the nitrogen or carbon, or both of the nitrogen and carbon are doped, and by suing the wire saw as shown in FIG. 2, the ingot 1a is sliced into a predetermined thickness, and the silicon wafer 11a in which the nitrogen or carbon, or both of the nitrogen and carbon are doped, is produced.

Figure 4:
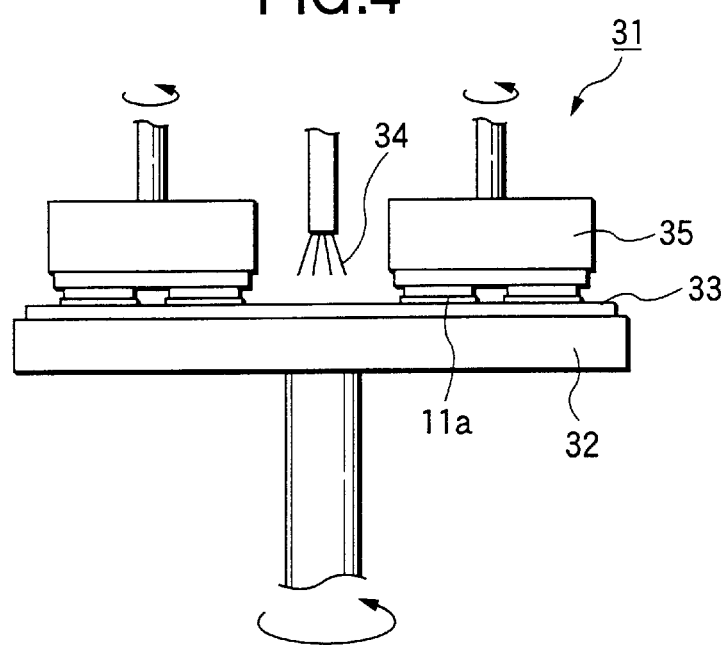
FIG. 4 is a schematic longitudinal sectional view of a specular polishing apparatus used for the production of the silicon wafer according to the present invention.
Figure 5:
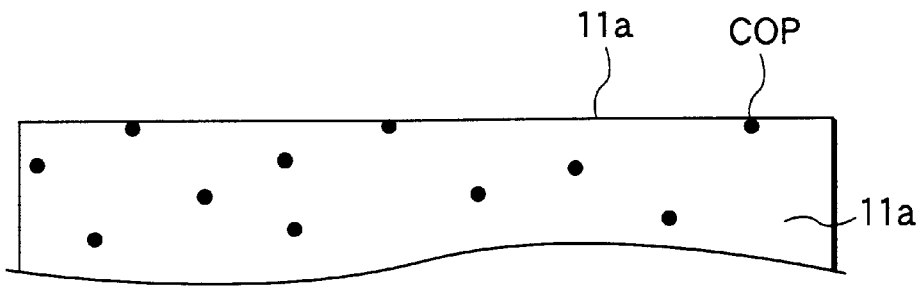
FIG. 5 is a schematic longitudinal sectional view for explaining the concept of COP existing in the silicon wafer.

After that, the silicon wafer hla is specular polished by using a specular polishing apparatus 31 as shown in FIG. 4. While an abrasive material 34 is injected into the polishing cloth 33 provided on a rotating disk 32 of the specular polishing apparatus 31, the silicon wafer ha adhered to a fitting disk 35 is pressed to the polishing cloth 33 and specular-polished. In the specular polished silicon wafer 11a, the COPs as shown in FIG. 5 exist.

Figure 6:
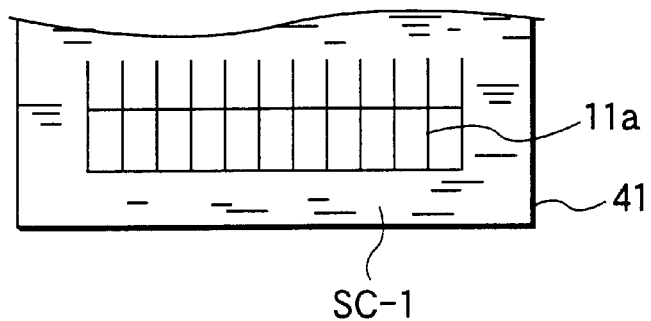
FIG. 6 is a schematic longitudinal sectional view of an etching tank used for the production of the silicon wafer according to the present invention.

Next, the specular polished silicon wafer 11a is etched by using a etching tank 41 which is full of the etching solution, as shown in FIG. 6.

For example, the etching solution is SC-1 (Standard Cleaning 1), and its composition is a ratio of ammonium 1: hydrogen peroxide 1–3: water 13, and the liquid temperature is 60–70° C., and the etching time period is 10–30 minutes. Most preferably, the composition is a ratio of ammonium 1: hydrogen peroxide 2: water 13, and the liquid temperature is 65° C., and the etching time period is 20 minutes.

Figure 7:
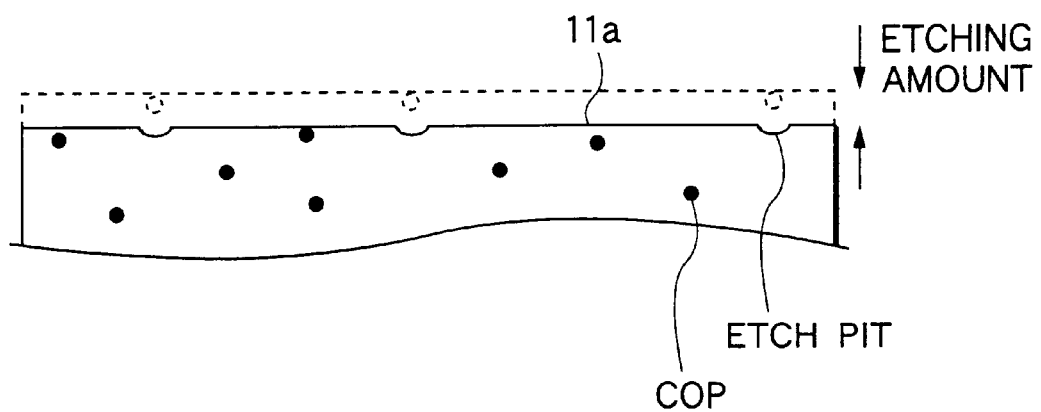
FIG. 7 is a schematic longitudinal sectional view for explaining the concept of an etch pit generated on the silicon wafer surface.

On the surface of thus etched specular polished wafer 11a, etch pits as shown in FIG. 7 appear.

When the silicon wafer 11a into which nitrogen or carbon, or both of nitrogen and carbon are doped, is specular polished, and further etched, the etch pits created on the surface of the specular polished wafer hla as described above, can be made such that the etch pit density not below 0.11 μm is not larger than 2 pits/cm$^2$, and the maximum size of the etch pit is not larger than 0.15 μm. This silicon wafer 11a is a silicon wafer in which the COP is easily vanished by the hydrogen annealing.

Further, when the specular polished wafer hla after the etching, is high temperature-annealed in the hydrogen atmosphere by using the heat treatment furnace 21 as shown in FIG. 3, the COP density of the surface layer up to 5 μm of the specular polished wafer hla can be made 0.03 pieces/cm$^2$, and the specular polished wafer 11a can be made to have no defect up to the surface layer of 5 μm. Accordingly, the aging breakdown characteristic of the oxide film of the silicon wafer can be increased, and the silicon wafer by which the yield of the semiconductor device can be greatly increased, can be produced.

In this connection, instead of the specular polished silicon wafer into which nitrogen or carbon, or both of nitrogen and carbon are doped, which is used in the present embodiment, the silicon wafer used in the first embodiment of the method of fabricating the silicon wafer, that is, the silicon wafer having the nitrogen density of $1\times10^{13}$–$5\times10^{16}$ atoms/cm$^3$, and the carbon density of $5\times10^{15}$–$3\times10^{16}$ atoms/cm$^3$, is used, and this silicon wafer is polished and the specular polished wafer is produced, and the specular polished wafer may be made so that, after the specular polished wafer is etched by using the etching solution, the etch pit density not below 0.11 μm created on the surface of the specular polished wafer is not larger than 2 pits/cm$^2$, and the maximum size of the etch pit is not larger than 0.15 μm. According to such the method of fabricating the silicon wafer, the silicon wafer by which the oxygen deposit of the high density can be uniformly deposited in the surface and the effect of the impurity content decreasing of heavy metals by the IG method can be improved, and further, the COP is easily vanished by the hydrogen annealing, can be produced.

Further, when the specular polished wafer after the etching, is high temperature-annealed in the hydrogen atmosphere in the same manner as the above description, the COP density up to the surface layer of 5 μm of the specular polished wafer can be made 0.03 pieces/cm$^2$, and because the specular polished wafer can be made to have no defect up to the surface layer of 5 μm, the silicon wafer by which the yield of the semiconductor device can be greatly increased, can be produced.

EXAMPLES

Test 1

Experimental Example 1

By using the silicon single crystal pulling up apparatus as shown in FIG. 1, the polycrystalline silicon as the raw material 100 kg is accommodated in the quartz glass crucible of, for example, 52 cm diameter, and after the silicon nitride of 1 kg is supplied as the dopant, it is fused, and the ring-shaped high purity carbon plate whose surface area is 1600 cm$^2$, is arranged above the silicon fused liquid, and the silicon ingot whose diameter is 8 inches, is pulled up at the pulling up speed of silicon single crystal of 1 mm/minute. From the central portion of the silicon ingot, the silicon wafer is quarried, and when the nitrogen density is analyzed by using the SIMS, and the carbon density is analyzed by using the FT-IR, the nitrogen density of the silicon ingot is $1\times10^{15}$ atoms/cm$^3$, and its carbon density is $2\times10^{16}$ atoms/cm3. Herein, the high purity carbon plate is arranged at a position separated from the liquid surface, and by the reaction of the heat from the fused liquid and evaporated silicon, it is uniformly diffused in the silicon fused liquid in the form of silicon carbide.

Further, when the COP on the surface of the wafer is measured by the particle counter, after one time of etching, in the range of 0.11–0.21 μm, the COP is 1.3 pieces/cm2, and the maximum size of the detected COP is 0.133 μm.

Test 2

Experimental Example 2

The pulling up condition is the same as in the Experimental example 1, and the shape and the arrangement position of the high purity carbon plate are changed and the silicon ingot is pulled up, and the silicon wafer is quarried and analyzed. The nitrogen density of the silicon ingot is $1\times10^{15}$ atoms/cm$^3$, and its carbon density is $5\times10^{16}$ atoms/cm$^3$.

Further, when the COP on the silicon wafer surface after one time of etching, is measured by the particle counter, in the range of 0.11–0.21 μm, the COP is 1.6 pieces/cm$^2$, and the maximum size of the detected COP is 0.148 μm.

Test 3

Comparative Example 1

The condition is the same as in the test 1, and the carbon plate is not arranged above the silicon fused liquid, and the silicon single crystal ingot is pulled up, and the silicon wafer is analyzed. The nitrogen density of the silicon ingot is $1\times10^{15}$ atoms/cm$^3$, and its carbon density is $1\times10^{15}$ is atoms/cm$^3$.

Further, when the COP on the silicon wafer surface after one time of etching, is measured by the particle counter, in the range of 0.11–0.21 μm, the COP is 2.8 pieces/cm$^2$, and the maximum size of the detected COP is 0.178 μm. The number of pieces of the COP in the comparative example is 2.8 pieces/cm$^2$, and this is considerably more than 1.3 pieces/cm2 in the Experimental example 1, and 1.6 pieces/cm2 in the Experimental example 2, and the maximum size of the COP is 0.178 μm, and is larger than 0.133 μm in the Experimental example 1, and 0.148 μm in the Experimental example 2.

Figure 8:
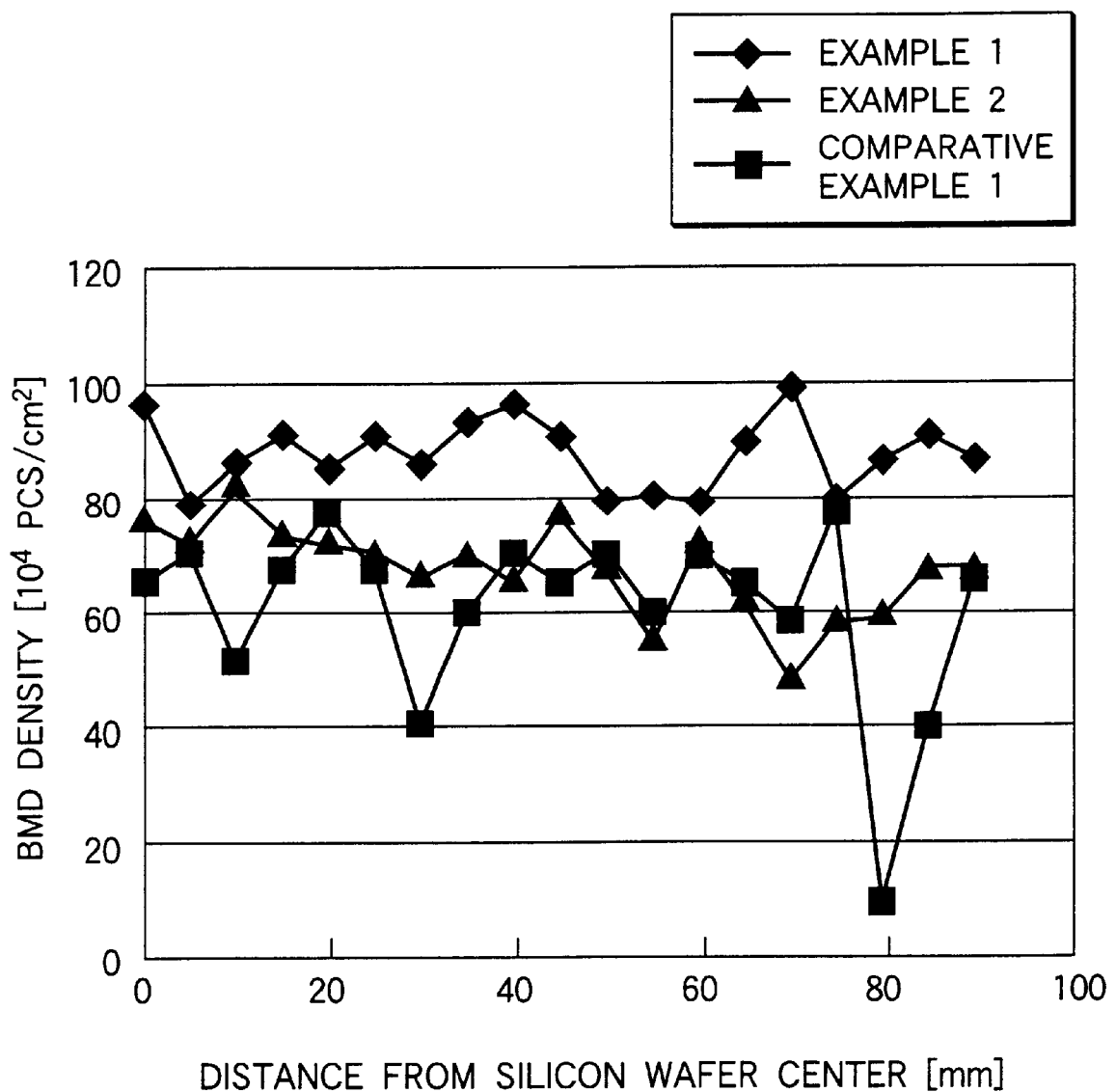
FIG. 8 is a characteristic view showing the measurement result of the BMD density of an embodiment.

Test 4:

The silicon wafer obtained by Test 1–3 is heat-treated (in oxygen atmosphere, at 780° C., for 3 hours, and at +1000° C., for 16 hours) and then, Sato etching is conducted, and the distribution in the surface in the diameter direction of the BMD density is measured by an optical microscope. The distribution condition of the BMD is shown in FIG. 8. In Experimental example 1, the BMD exists over the whole range many and uniformly, in the number of $8$–$10\times10^5$ pieces/cm$^2$, and a good gettering effect can be obtained. In Experimental example 2, the BMD fluctuates in the number of pieces depending on the position of the silicon wafer. In the comparative example 1, the BMD is few, that is, $6$–$8\times10^5$ pieces/cm$^2$, and further, at the intermediate portion in the radial direction, it is few, that is, $5\times10^5$ pieces/cm$^2$, and is fluctuated.

Test 5:

After the silicon wafers obtained in Tests 1–3, are annealed in the hydrogen atmosphere at 1200° C., for one hour, the surfaces of them are thermal oxidation processed, and oxidized by 400 nm. Then, the oxide film is peeled off by HF, and the COP (size$\geq$0.135 μm) in the depth direction is measured in the form in which the COP is integrated on the surface. In the Experimental example 1, 1 piece/wafer, and in the Experimental example 2, 2 pieces/wafer, and it is found that the COP is greatly few in both examples. In the comparative example 1, the COP is 8 pieces/wafer, and greatly many.

Test 6:

After the silicon wafers obtained in Tests 1–3, are annealed in the hydrogen atmosphere at 1200° C., for one hour, the surfaces are re-polished and removed up to the depth of 5 μm from the surface. The COP of the surface after the removal is measured. In the Experimental example 1, 1 piece/wafer, and in the Experimental example 2, 1 piece/wafer, and it is found that the there is no defect up to the depth of 5 μm from the surface in both examples. In the comparative example, it is 20 pieces/wafer, and found that many COPs exist.

According to the attached drawings, the third embodiment of the method of fabricating the silicon wafer according to the present invention will be described below.

Figure 9:
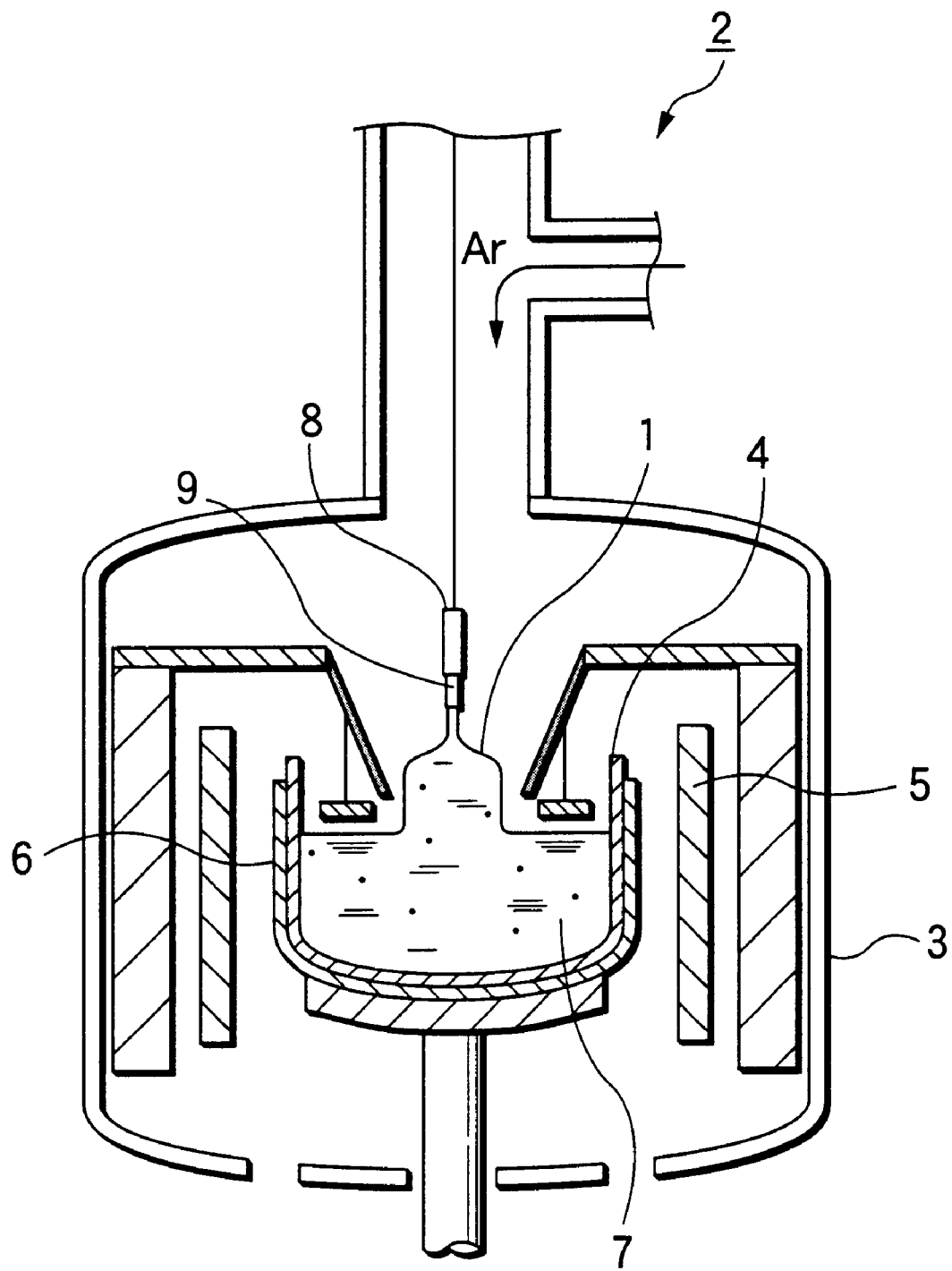
FIG. 9 is an explanation view of the single crystal pulling up apparatus used for the pulling-up of a silicon single crystal ingot according to the present invention.
Figure 10:
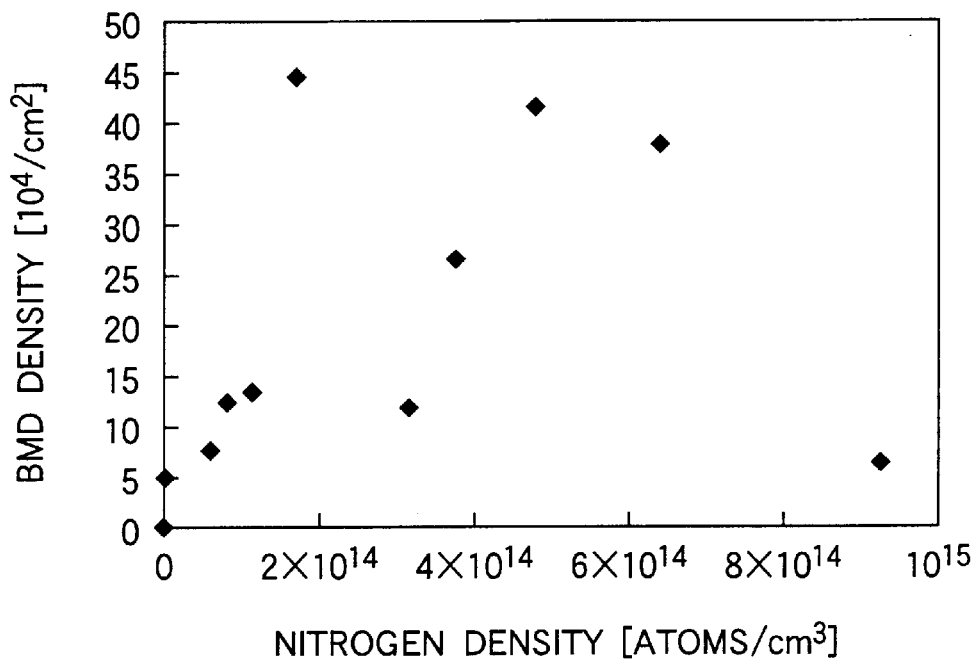
FIG. 10 is a view of the result in which the relationship between the nitrogen density and the BMD of the embodiment, produced by the method of fabricating the silicon wafer according to the present invention, is measured.

The silicon single crystal ingot used for the production a of the silicon wafer according to the present invention is pulled up by using the single crystal pulling up apparatus 1 as shown in FIG. 9.

For example, it is conducted in such a manner that polycrystalline silicon as a raw material is filled in the quartz glass crucible 4 arranged in the chamber 3 of the single crystal pulling up apparatus 2, further, as a dopant to dope nitrogen, a predetermined amount of silicon nitride is supplied in it, and the polycrystalline silicon is heated and fused by the heater 5 provided in the outer periphery of the quartz glass crucible 4, then, the seed crystal 9 attached onto the seed chuck 8 is dipped in the silicon fused liquid 7 into which nitrogen is doped, and while the seed chuck 8 and the quartz glass crucible 4 are rotated at a predetermined rotating speed in the same direction or reversal direction, the seed chuck 8 is pulled up, and the silicon single crystal ingot 1 is grown and pulled up at a predetermined pulling up speed.

The nitrogen density of thus pulled up silicon single crystal ingot 1 is $0.01 \times 10^{15} - 5.0 \times 10^{15}$ atoms/cm$^3$.

When the nitrogen density is not larger than $0.01 \times 10^{15}$ atoms/cm$^3$, it can not be expected to sufficiently cause the un-uniform nucleus formation, and the single crystallization itself of the silicon single crystal exceeding $5.0 \times 10^{15}$ atoms/cm$^3$ is prevented.

The silicon single crystal ingot pulled up as described above is sliced into a predetermined thickness by using a wire saw as used generally, by a wire travelling among rotating rollers, and the silicon wafer is produced. Thus produced silicon wafer has the nitrogen density of $0.01 \times 10^{15} - 5.0 \times 10^{15}$ atoms/cm$^3$, which is the same as the silicon single crystal ingot.

Next, this silicon wafer is heat-treated by using a generally used thermal treatment furnace. For example, it is hydrogen annealed in the hydrogen atmosphere, at the temperature range of 1000–1400° C., for longer than 10 minutes. By this hydrogen annealing, the COP in the 0.2 $\mu$m depth of the surface layer of the silicon wafer 11 is made not larger than 3 pieces per wafer, and further, the BMD (Bulk Micro Defect, oxygen deposit) density inside the wafer (crystal portion) other than 0.4 $\mu$m depth of the surface layer can be made not lower than $0.5 \times 10^5$/cm$^3$.

In the production process of the silicon wafer described above, in order to pull up the silicon single crystal ingot from the silicon fused liquid into which nitrogen is doped, the growth of the holes is suppressed and the COP is decreased. Further, the remained holes become deposit core, and the deposit of the interstitial oxygen is increased. Accordingly, the deposit can be made more than that having the same oxygen density as the silicon wafer, into which nitrogen is not doped, and the IG effect can be increased. Further, because the defect formation temperature zone is changed by the nitrogen doping, the COP having the small size can be obtained. Further, because it is not necessary that the pulling up speed of the silicon single crystal is made low as in the conventional one, the pulling up speed can be made high, and the productivity can be increased.

Further, in the hydrogen annealing process, although the COP of the surface layer of the silicon wafer is vanished, because the BMD density is increased by the nitrogen doping, the BMD density sufficiently exists inside the wafer, and the IG ability is not lowered.

As in the third embodiment, in the silicon wafer which is produced by using the silicon single crystal ingot 7, doped with a predetermined amount of nitrogen and pulled up, and is sliced, and hydrogen annealed at a predetermined temperature range for a predetermined time period, the crystal defect of the surface layer is decreased, and the BMD density inside the wafer can be increased.

Accordingly, the COP (etch pit) on the surface layer is deleted, and the aging dielectric breakdown characteristic of the oxide film of the semiconductor device is nor deteriorated, and also in the production process of the semiconductor device, the yield can be increased, and further, the sufficient IG effect can be obtained, and the OSF by the heavy metal contamination is not generated, and the oxide film withstand voltage characteristic of the semiconductor device can be increased.

Next, the fourth embodiment of the method of fabricating the silicon wafer according to the present invention will be described.

The present fourth embodiment is a method of fabricating the silicon wafer in which, after the silicon wafer produced in the same manner as the third embodiment, is specular-polished, by the hydrogen annealing, the density of the LSTD not below the dimension of 70 nm is made not lower than 3 pieces/cm$^2$ in the area up to the depth of 5 $\mu$m from the surface layer of the silicon wafer, and the BMD not below the dimension of 70 nm is made to exist with the high density in the area not below 10 $\mu$m.

For example, in the same manner as in the third embodiment, the ingot is pulled up from the silicon fused liquid into which a predetermined amount of nitrogen is doped, and sliced, and the silicon wafer is produced. After this silicon wafer is specular-polished, it is hydrogen-annealed at the predetermined temperature, for a predetermined time period. By the hydrogen annealing, the COP of the surface layer and the BMD of the surface layer are vanished, and inside the wafer, the BMD is grown with the high density. As the result, in the silicon wafer, the density of LSTD not below the dimension of 70 nm is not below 3 pieces/cm$^2$ in the area up to 5 $\mu$m from the surface layer, and the BMD not below the dimension of 70 nm exists with the high density in the area of the depth of not below 10 $\mu$m. Accordingly, the crystal defect does not exist on the surface layer, and sufficient BMD exists in its inside, and the high quality silicon wafer which fully exhibits the IG effect, can be produced.

Next, the fourth embodiment of the method of fabricating the silicon wafer according to the present invention will be described.

In the fourth embodiment, when the nitrogen density and oxygen density of the silicon wafer to be produced are made in a predetermined range, the LSTD in the depth up to 5 $\mu$m from the surface layer of the silicon wafer after the heat treatment, is decreased, and the BMD density is increased.

For example, in the same manner as in the first embodiment, it is conducted in such manner that the seed crystal 9 attached to the seed chuck is dipped in the silicon fused liquid into which a predetermined amount of the nitrogen is doped, and while the seed chuck and the quartz glass crucible are rotated at a predetermined rotating speed in the same direction or the reversal direction, the seed chuck is pulled up and the silicon single crystal ingot is grown, and it is pulled up at a predetermined pull-up speed. The nitrogen density of thus pulled up silicon single crystal ingot is made $6 \times 10^{13} - 2 \times 10^{15}$ atoms/cm$^3$, and oxygen density is $0.8 \times 10^{18} - 1.2 \times 10^{18}$ atoms/cm$^3$. By the nitrogen doping, flocculation of the atomic holes in the silicon is suppressed, and the maximum size of the crystal defect is reduced.

When the nitrogen density is not larger than $6 \times 10^{13}$ atoms/cm$^3$, the growth of the crystal defect introduced in the crystal growth can not sufficiently be suppressed, and when it exceeds 2×10$^{18}$ atoms/cm$^3$, the single crystallization itself of the silicon single crystal is prevented.

When the oxygen density is not larger than 0.8×10$^{18}$ atoms/cm$^3$, the deposit of oxygen is promoted by the nitrogen doping, however, the deposit of the oxygen is insufficient, the BMD density is small, and the IG effect can not be sufficiently expected, and further, when the oxygen density exceeds 1.2×10$^{18}$ atoms/cm$^3$, the deposit is too much, and badly affects the semiconductor device characteristic.

The silicon wafer sliced from the silicon single crystal ingot is heat-treated in the atmosphere of H$_2$, Ar, N$_2$, or inert gas, reduction gas, or mixed gas of them, and most preferably H$_2$, at not lower than 1100° C. for not shorter than 1 minute.

In this heat treatment process, when the silicon wafer having the nitrogen density of 6×10$^{13}$–2×10$^{15}$ atoms/cm$^3$, and oxygen density of 0.8×10$^{18}$–1.2×10$^{18}$ atoms/cm$^3$, is heat-treated at not lower than 1100° C. for not shorter than 1 minute, the oxygen and nitrogen of the silicon surface layer are outward diffused, and the Grown-in defect of the surface layer of the silicon wafer, and the LSTD density up to 5 μm from the surface layer is made not larger than 1 piece/cm$^2$, and the BMD density can be made not lower than 7×10$^4$ pieces/cm$^2$.

As described in the fifth embodiment, in the silicon wafer which is produced by using the silicon single crystal ingot pulled up after a predetermined amount of nitrogen is doped, and sliced, and heat-treated at a predetermined temperature range for a predetermined time period, the crystal defect of the surface layer is decreased, and the BMD density inside the wafer can be increased.

Accordingly, the LSTD density on the surface layer is not larger than 1 piece/cm$^2$, the aging dielectric breakdown characteristic of the oxide film of the semiconductor device is not deteriorated, also in the production process of the semiconductor device, the yield can be increased, and further, sufficient IG effect is obtained, the OSF by the heavy metal contamination is not generated, and the oxide film withstand voltage characteristic of the semiconductor device can be increased. Further, because the heat treatment time period is a short time, there is also no heavy metal contamination from the thermal treatment furnace.

Test 1

Experimental Example 3, Conventional Example 1

The quartz glass crucible of the diameter of 22 inches is used and the silicon nitride is supplied into the polycrystalline silicon which is a raw material, of 100 kg so that the liquid becomes a predetermined density, and the silicon single crystal ingot is pulled up at the pulling up speed of 1.1–1.2 mm/minute, and the silicon wafer having the nitrogen density of 0.2×10$^{15}$–1.0×10$^{15}$ atoms/cm$^3$, and the oxygen density of 1.0×10$^{18}$–1.2×10$^{18}$ atoms/cm$^3$ is produced. This wafer is heat-treated in the 1200° C. hydrogen atmosphere for 1 hour (Experimental example 3). Further, in the same manner, the nitrogen is not doped, and the silicon single crystal ingot is pulled up and the silicon wafer is produced, and heat-treated in the 1200° C. hydrogen atmosphere for 1 hour (conventional example 1). The oxygen density and nitrogen density before the heat treatment, and the BMD and COP after the heat treatment, of the Experimental example 3 and the conventional example 1 are measured. The COP measurement is conducted in such a manner that the oxide film of 0.4 μm is formed on the surface, and the oxide film is removed by the dilute hydrofluoric acid, and the COP not below 0.135 μm after the SC-1 etching, is counted. By this manner, the COP of the depth of 0.2 μm can be counted in the integrated form.

(Result)

(1) The estimation result is shown in Table 1.

TABLE 1

The relationship of the execution or not of the nitrogen doping, and BMD and COP

| | Example 1 | Conventional example 1 |
|---|---|---|
| Nitrogen density (atoms/cm$^3$) | 0.02 – 1.0 × 10$^{15}$ | 0 |
| Oxygen density (atoms/cm$^3$) | 1.0 – 1.2 × 10$^{18}$ | 1.0 – 1.2 × 10$^{18}$ |
| BMD (pcs/cm$^2$) | 0.5 – 5.0 × 10$^5$ | 0 – 5.0 × 10$^4$ |
| COP (pcs/cm$^2$) | below 3 | 15–25 |

The BMD of the Experimental example 3 is 0.5–5.0×10$^5$ pieces/cm$^2$, and in contrast to this, the BMD of the conventional example 1 is 0×10$^4$–5.0×10$^4$ pieces/cm$^2$, and in the Experimental example 3, the BMD density is higher by about 10 times.

Figure 11:
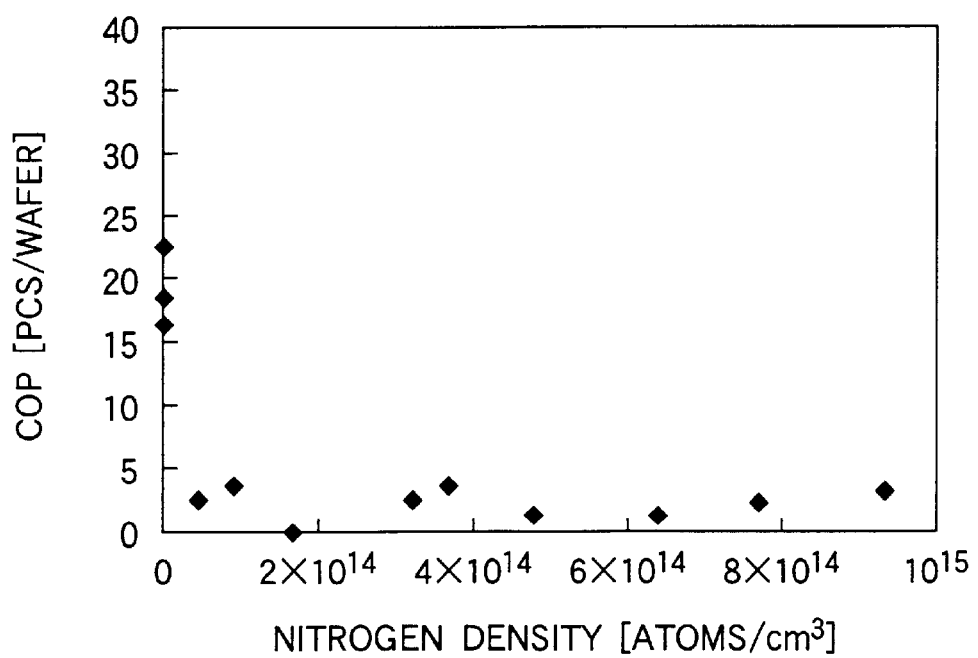
FIG. 11 is a view of the result in which the relationship between the nitrogen density after the hydrogen annealing and the COP of the embodiment, produced by the method of fabricating the silicon wafer according to the present invention, is measured.

(2) The relationship of the nitrogen density and the BMD of the Experimental example 3 and the conventional example 1 is shown in FIG. 11. In the Experimental example 3, it is confirmed that the BMD density is high over the whole nitrogen density area.

(3) The relationship of the nitrogen density and the COP after hydrogen annealing, of the Experimental example 3 and the conventional example 1 is shown in FIG. 11. In the Experimental example 3, it is confirmed that the COP density is low, that is, 0–3 pieces/wafer, over the whole nitrogen density area, however, in the conventional example 1, it is 15–20 pieces/wafer, which is about 6 times more than the Experimental example 3.

Test 2:

The LSTD of the surface layer and cross section of the wafer in the Experimental example 3 and the conventional example 1 is estimated. For the surface layer STD, 2 kind of wavelengths are used, and defects existing in the area of the depth of 5 μm, 1 μm are detected, and by repeatedly conducting this measurement on the sample polished in the depth direction, the area (depth) in which defects exist, is defined. For the sectional LSTD, the area of about 200 μm depth from the wafer surface is observed. The size of the defect which can be measured as the LSTD is about 70 nm. In this connection, the judgement of the COP and the BMD is according to the observation by AFM (Atomic Force Microscopy) and TEM (Transmission Electron Microscopy)

(Result):

For the wafer in the Experimental example 3, as shown in Tables 2–4, the LSTD density more than 70 nm is not larger than 1 piece/cm$^2$ in the area of the surface layer 0–5 μm, and in the area more than 10 μm, it is confirmed that the BMD exists. In contrast to this, for the wafer in the conventional example 1, many LSTD exist in the area of the surface layer 0–10 μm. When this defect is observed by the AFM and TEM, it is confirmed that many COPs exist. Further, although the BMD exists, it is small.

Experimental Example 4

The silicon wafer produced in the same manner as in Test 1 is heat-treated in the hydrogen atmosphere for 10 minutes (Experimental example 4). For the Experimental example 4, the surface layer and sectional LSTD are estimated in the same manner as Test 2.

(Result):

As shown in Tables 2–4, the LSTD density more than 70 nm is not larger than 1 piece/cm² in the area of the surface layer 0–5 μm, and in the area more than 10 μm, it is confirmed that the high density BMD exists.

Comparative Example 1

For the wafer in which the hydrogen atmosphere processing is not conducted on the silicon wafer produced in the same manner as in Test 1 (Comparative example 1), the surface layer and sectional LSTD are estimated in the same manner as in Test 2.

(Result):

As shown in Tables 2–4, many LSTD exist in the area of the surface layer 0–5 μm. When this defect is observed by the AFM and TEM, it is confirmed that both of COP and BMD exist.

Experimental Example 5

The silicon wafer produced in the same manner as in Test 1 is heat-treated in the argon atmosphere for 1 hour (Experimental example 5). For the Experimental example 5, the surface layer and sectional LSTD are estimated in the same manner as Test 2.

(Result):

As shown in Tables 2–4, the LSTD density more than 70 nm is not larger than 1 piece/cm² in the area of the surface layer 0–5 μm in the same manner as in the Experimental example 5, and in the area more than 10 μm, it is confirmed that the BMD exists. However, as compared to the Experimental example 3, it is confirmed that, in the Experimental example 3, the defect density, size, and area can be more effectively controlled. Further, it is confirmed that several COPs remain on the surface.

TABLE 2

LSTD in the depth direction

| Depth μm | Example 1 | Example 2 | Comparative example 1 | Example 3 | Conventional example 1 |
|---|---|---|---|---|---|
| Condition | Nitrogen contained hydrogen 1 hour | Nitrogen contained hydrogen 10 minutes | Nitrogen contained no thermal treatment | Nitrogen contained Ar 1 hour | No nitrogen hydrogen 1 hour |
| Surface layer 0–5 | 0.3 | 1 | 200 | 0.8 | 20 |
| Surface layer 5–10 | 0.4 | 100 | 500 | 7.0 | 600 |
| Surface layer 10–15 | 400 | 400 | 200 | 300 | 200 |
| Surface layer 15–20 | 500 | 300 | 200 | 600 | 300 |

(Pieces/cm²)

TABLE 3

Separation of COP and BMD by TEM

| Depth μm | Example 1 | Example 2 | Comparative example 1 | Example 3 | Conventional example 1 |
|---|---|---|---|---|---|
| Surface layer 0–0.2 | No defect | No defect | COP BMD | COP | COP |
| Surface layer 10–15 | BMD | BMD | COP BMD | COP (few) BMD (many) | COP (many) BMD (few) |
| Surface layer 20–200 | COP (few) BMD (many) | COP (few) BMD (many) | COP BMD | COP (few) BMD (many) | COP (many) BMD (few) |

TABLE 4

Comparison of sectional LSTD (BMD) density

| | Example 1 | Example 2 | Comparative example 1 | Comparative example 2 | Conventional example 2 |
|---|---|---|---|---|---|
| BMD (pcs/cm³) | 5 × 10⁹ | 3 × 10⁹ | 1 × 10⁹ | 1 × 10⁹ | 1 × 10⁷ |

Test 3 (Experimental example 6): A 22 inch diameter quartz glass crucible is used, and the silicon nitride is supplied into the raw material polycrystalline silicon of 100 kg, and the silicon single crystal ingot is pulled up. In this case, the pulling up speed of the ingot cylindrical portion is 1.1–1.2 mm/minute, and the nitrogen density is controlled by a supply amount of the silicon nitride. The silicon wafer having the nitrogen density of $2 \times 10^{15}$ atoms/cm³, and the oxygen density of $1.2 \times 10^{18}$ atoms/cm³ is quarried from the pulled up silicon single crystal ingot, and after the specular polishing, it is heat-treated in the hydrogen atmosphere at 1200° C. for 1 hour (Experimental example 6), and the LSTD density up to the surface layer 5 μm is estimated by the IR laser scattering tomography. Further, the silicon wafer of the Experimental example 6 is cleaved and its cross section is etched in the mixed liquid of HF:HNO₃:CH₃COOH:H₂O=1:12.7:3:5.7 for 3 minutes, and by using the optical microscope, the BMD density of the position up to the depth of 10 μm from the surface is estimated.

(Result):

As the result of the estimation is shown in Table 5, the LSTD density up to the surface layer 5 μm is 0.349 (pieces/cm²) and below 1 (piece/cm²), and the BMD density is $30.2 \times 10^4$ (pieces/cm²), which is many.

Experimental Example 7

The silicon single crystal ingot whose nitrogen density is decreased is pulled up by the same pulling up method as in the test 3.

For the wafer in which the silicon wafer whose nitrogen density is $6 \times 10^{13}$ atoms/cm³ and oxygen density is $1.2 \times 10^{18}$ atoms/cm³, quarried from the pulled up silicon single crystal ingot is heat-treated in the same manner as the test 3, (Experimental example 5), the LSTD density and the BMD density are estimated in the same manner as the test 3.

(Result):

As the estimation result is shown in Table 5, the LSTD density is 0.877 (pieces/cm²) and below 1 (piece/cm²), and the BMD density is $7.75 \times 10^4$ (pieces/cm²), which is lower than the Experimental example 6, but, is more than the comparative example 3.

Comparative Example 2

The silicon single crystal ingot whose nitrogen density is decreased is pulled up by the same pulling up method as in the test 3. For the wafer in which the silicon wafer quarried from the pulled up silicon single crystal ingot whose nitrogen density is $5 \times 10^{13}$ atoms/cm$^3$ and oxygen density is $1.2 \times 10^{18}$ atoms/cm$^3$, is heat-treated in the same manner as the test 3 (Comparative example 2), the LSTD density and the BMD density are estimated in the same manner as the test 3.

(Result):

As the estimation result is shown in Table 5, the LSTD density is 1.26 (pieces/cm$^2$) and above 1 (piece/cm$^2$), and the BMD density is $6.25 \times 10^4$ (pieces/cm$^2$), which is not so many.

Conventional Example 2

The silicon single crystal ingot into which nitrogen is not doped, is pulled up by the same pulling up method as in the test 7. For the wafer in which the silicon wafer quarried from the pulled up silicon single crystal ingot whose nitrogen density is 0 atoms/cm$^3$ and oxygen density is $1.2 \times 10^{18}$ atoms/cm$^3$, is heat-treated in the same manner as the test 3 (Comparative example 2), the LSTD density and the BMD density are estimated in the same manner as the test 3.

(Result):

As the estimation result is shown in Table 5, the LSTD density is 26.4 (pieces/cm$^2$) and greatly above 1 (piece/cm$^2$), and the BMD density is $0.08 \times 10^4$ (pieces/cm$^2$) which is greatly few.

TABLE 5

Relationship among nitrogen density and LSTD and BMD

|  | Example 4 | Example 5 | Comparative example 2 | Conventional example 2 |
| --- | --- | --- | --- | --- |
| Nitrogen density (atoms/cm$^3$) | $2 \times 10^{15}$ | $6 \times 10^{13}$ | $5 \times 10^{13}$ | 0 |
| LSTD (pcs/cm$^2$) | 0.349 | 0.877 | 1.26 | 26.4 |
| BMD × 10$^4$ (pcs/cm$^2$) | 30.2 | 7.75 | 6.25 | 0.08 |

From the Experimental example 6 and the Experimental example 7, it can be confirmed that the silicon wafer whose nitrogen density is $6 \times 10^{13}$–$2 \times 10^{15}$ (atoms/cm$^3$) and oxygen density is $1.7 \times 10^{18}$–$1.2 \times 10^{18}$ (atoms/cm$^3$) is changed to the wafer in which the LSTD density is below 1 piece/cm$^2$, and the BMD density is $7 \times 10^4$ pieces/cm$^2$ after the thermal treatment.

In the comparative example 2 in which the nitrogen density is decreased, as compared to the Experimental example 6 and the Experimental example 7, in both of the LSTD density and the BMD density, the degree of the improvement is not so high.

In the conventional example 2 in which nitrogen is not doped, both of the LSTD density and the BMD density are greatly separated from the required value.

According to the silicon single crystal ingot, its production method and the method of fabricating the silicon wafer according to the present invention, the silicon wafer by which the oxide film voltage withstand characteristic of the semiconductor device is increased, and the yield of the semiconductor device can be increased, and which can be pulled up at high speed, can be produced.

That is, in the silicon single crystal ingot which is pulled up from the silicon fused liquid in which nitrogen and carbon are doped into polycrystalline silicon, by using the Czochralski method, because the nitrogen density is $1 \times 10^{13}$–$5 \times 10^{15}$ atoms/cm$^3$, and the carbon density is $5 \times 10^{15}$–$3 \times 10^{16}$ atoms/cm$^3$, by heat-treating the silicon wafer produced from this silicon single crystal ingot, the low density area of the BMD density generated inside the OSF ring shape can be improved, and the oxygen deposit whose density is higher than usual is uniformly deposited in the surface, and the impurity containing amount decreasing effect of heavy metals by the intrinsic gettering can be improved.

In the method of fabricating the silicon single crystal ingot using the Czochralski method, because the nitrogen density of the silicon single crystal ingot which is pulled up from the silicon fused liquid in which nitrogen and carbon are doped into polycrystalline silicon, is $1 \times 10^{13}$–$5 \times 10^{15}$ atoms/cm$^3$, and the carbon density is $5 \times 10^{15}$–$3 \times 10^{16}$ atoms/cm$^3$, by heat-treating the silicon wafer produced from this silicon single crystal ingot pulled up by this production method, the low density area of the BMD density generated inside the OSF ring shape can be improved, and the oxygen deposit whose density is higher than usual is uniformly deposited in the surface, and the impurity containing amount decreasing effect of heavy metals by the intrinsic gettering can be improved.

Because the carbon doping is conducted by placing the carbon plate above the silicon fused liquid and fusing it, the carbon doping can be easily conducted, and carbon can be uniformly doped in the silicon fused liquid.

Because this method is the method of fabricating the silicon wafer in which, from the silicon fused liquid in which nitrogen and carbon are doped into polycrystalline silicon, by using the Czochralski method, the silicon single crystal ingot whose nitrogen density is $1 \times 10^{13}$–$5 \times 10^{15}$ atoms/cm$^3$, and carbon density is $5 \times 10^{15}$–$3 \times 10^{16}$ atoms/cm$^3$, is pulled up, and the pulled up silicon single crystal ingot is sliced and the silicon wafer is produced, and further heat treated, and the crystal defect having inside the gettering effect is formed, the low density area of the BMD density generated inside the OSF ring shape can be improved, and the oxygen deposit whose density is higher than usual is uniformly deposited in the surface, and the impurity containing amount decreasing effect of heavy metals by the intrinsic gettering can be improved.

Because this method is the method of fabricating the silicon wafer in which the silicon single crystal ingot pulled up from the silicon fused liquid in which nitrogen or carbon, or both of nitrogen and carbon are doped into polycrystalline silicon, by using the Czochralski method, is sliced and the silicon wafer is produced, then, the silicon wafer is polished and the specular polished wafer is produced, and after the specular polished wafer is etched by using the etching solution, the etch pit density not below 0.11 μm created on the surface of the specular polished wafer is made not above 2 pieces/cm$^2$, and the maximum size of the etch pit is made not above 0.15 μm, the silicon wafer in which the COP is easily vanished by the hydrogen annealing, can be produced. Further, when the high temperature annealing is conducted in the hydrogen atmosphere, the COP density up to the surface layer 5 μm of the specular polished wafer can be made 0.03 pieces/cm$^2$, and because it can be made no defect up to the surface layer 5 μm, the silicon wafer by which the yield of the semiconductor device can be greatly increased, can be produced.

Because this method is the method of fabricating the silicon wafer in which, by using the silicon wafer in which the silicon single crystal ingot pulled up from the silicon fused liquid in which nitrogen and carbon are doped into polycrystalline silicon, by using the Czochralski method, and whose nitrogen density is $1 \times 10^{13}$–$5 \times 10^{15}$ atoms/cm$^3$, and carbon density is $5 \times 10^{15}$–$3 \times 10^{16}$ atoms/cm$^3$, is sliced and produced, the silicon wafer is polished and the specular polished wafer is produced, and after the specular polished wafer is etched by using the etching solution, the etch pit density not below 0.11 $\mu$m created on the surface of the specular polished wafer is made not above 2 pieces/cm$^2$, and the maximum size of the etch pit is made not above 0.15 $\mu$m, the high density oxygen deposit is uniformly deposited in the surface, and the impurity containing amount decreasing effect of heavy metals by the intrinsic gettering can be improved, and by hydrogen annealing, the silicon wafer in which the COP is easily vanished can be produced, and by conducting the high temperature annealing in the hydrogen atmosphere, the COP density up to the surface layer 5 $\mu$m of the specular polished wafer can be made 0.03 pieces/cm$^2$, and because it can be made no defect up to the surface layer 5 $\mu$m, the silicon wafer by which the yield of the semiconductor device can be greatly increased, can be produced.

Because the etched silicon wafer is the wafer produced by the method of fabricating the silicon wafer which is heat treated in the high temperature hydrogen atmosphere, the COP density up to the surface layer 5 $\mu$m of the specular polished wafer can be made 0.03 pieces/cm$^2$, and because it can be made no defect up to the surface layer 5 $\mu$m, the silicon wafer by which the yield of the semiconductor device can be greatly increased, can be produced.

In the etching, because the composition of the etching solution is a ratio of ammonium 1: hydrogen peroxide 2: water 13, and the liquid temperature is 60–70° C. and the etching time period is 10–30 minutes, a predetermined amount of etching can be quickly conducted, and the COP on the surface layer of the silicon wafer can be securely removed.

Further, because this method is the method of fabricating the silicon wafer by which the silicon single crystal ingot pulled up from the silicon fused liquid in which nitrogen is doped, by using the Czochralski method, is sliced and the silicon wafer is produced, and the silicon wafer is hydrogen annealed and the crystal defect on the surface layer is decreased, and the BMD density inside the wafer is increased, the COP in the surface layer 0.2 $\mu$m of the silicon wafer is made not above 3 pieces, and the BMD density in the inside of the wafer other than this surface layer 0.2 $\mu$m can be made not below $0.5 \times 10^5$/cm$^2$, and the aging dielectric breakdown characteristic of the oxide film of the semiconductor device is not deteriorated, and also in the semiconductor device production process, the yield can be increased, further, sufficient IG effect is obtained, and the OSF by the heavy metal contamination is not generated, and the oxide film withstand voltage characteristic of the semiconductor wafer can be increased.

Because the nitrogen density contained in the crystal of the silicon wafer is $0.01 \times 10^{15}$–$5.0 \times 10^{15}$ atoms/cm$^3$, and the oxygen density is $0.7 \times 10^{18}$–$1.4 \times 10^{18}$ atoms/cm$^3$, the COP in the surface layer 0.2 $\mu$m of the silicon wafer is easily made not above 3 pieces, and further the BMD density in the inside of the wafer other than this surface layer 0.2 $\mu$m can be made not below $0.5 \times 10^5$/cm$^2$.

Because the hydrogen annealing is conducted in the temperature range of 1000–1400° C. for more than 10 minutes, the COP in the surface layer 0.2 $\mu$m of the silicon wafer is easily made not above 3 pieces, and further the BMD density in the inside of the wafer other than this surface layer 0.2 $\mu$m can be made not below $0.5 \times 10^5$/cm$^2$.

Because this method is the method of fabricating the silicon wafer by which the COP in the surface layer 0.2 $\mu$m of the hydrogen annealed silicon wafer is easily made not above 3 pieces per wafer, the aging dielectric breakdown characteristic of the oxide film of the semiconductor device is not deteriorated, and also in the semiconductor device production process, the yield can be increased.

Because this method is the method of fabricating the silicon wafer in which, in the area of the surface layer 0 to 5 $\mu$m of the hydrogen annealed silicon wafer, the LSTD density not blow the dimension of 70 nm is not above 3 pieces/cm$^3$, and in the area of the surface layer not below 10 $\mu$m, the BMD not below 70 nm exists in the high density, the high quality silicon wafer in which, in the area up to 5 $\mu$m from the surface layer of the silicon wafer, the LSTD density not blow the dimension of 70 nm is not above 3 pieces/cm$^3$, and in the area not below 10 $\mu$m, the BMD not below 70 nm exists in the high density, and no crystal defect exists on the surface layer, and in its inside, the BMD sufficiently exists, and the IG effect is fully exhibited, can be produced.

Because this method is the method of fabricating the silicon wafer by which the BMD density of the hydrogen annealed silicon wafer is made not below $0.5 \times 10^5$/cm$^2$, the BMD density in the inside of the wafer can be made not below $0.5 \times 10^5$/cm$^2$, and the IG effect can be sufficiently obtained, and the OSF by the heavy metal contamination is not generated, and the oxide film withstand voltage characteristic of the silicon wafer can be increased.

Further, because this method is the method of fabricating the silicon wafer in which the silicon single crystal ingot which is pulled up from the silicon fused liquid in which nitrogen is doped into polycrystalline silicon, by using the Czochralski method, is sliced, and the silicon wafer is produced, and the nitrogen density of the silicon wafer is $6 \times 10^{13}$–$2 \times 10^{15}$ atoms/cm$^3$, and the oxygen density is $0.8 \times 10^{18}$–$1.2 \times 10^{18}$ atoms/cm$^3$, by heat treating it, the oxygen and nitrogen on the silicon wafer surface are outward diffused, and the Grown-in defect of the surface layer of the silicon wafer, and the LSTD density up to the surface layer 5 $\mu$m is made not above 1 piece/cm$^2$, and the BMD density can be made not below $7 \times 10^4$ pieces/cm$^2$, and the crystal defect of the surface layer of the silicon wafer is decreased, and the BMD density inside the wafer can be increased.

Further, because this method is the method of fabricating the silicon wafer in which the silicon wafer is heat-treated in the atmosphere of H2, Ar, N2, or inert gas, reduction gas, or mixed gas of them, at above 1100° C. for more than 1 minute, and the LSTD density up to the surface layer 5 $\mu$m is made below 1 piece/cm$^2$, and the BMD density in the area above the depth of 10 $\mu$m is made not below $7 \times 10^4$ pieces/cm$^2$, the Grown-in defect of the surface layer of the silicon wafer, LSTD density up to the surface layer 5 $\mu$m can be made below 1 piece/cm$^2$, and the BMD density in the area not below the depth of 10 $\mu$m can be made not below $7 \times 10^4$ pieces/cm$^2$, and the aging dielectric breakdown characteristic of the oxide film of the semiconductor device is not deteriorated, and also in the semiconductor device production process, the yield can be increased, and the IG effect can be sufficiently obtained, and the OSF by the heavy metal contamination is not generated, and the oxide film withstand voltage characteristic of the silicon wafer can be increased.

Further, because the thermal treatment time period is a short time, there also be no heavy metal contamination from the thermal treatment furnace.

Further, because this method is the method of fabricating the silicon wafer in which the silicon wafer is heat-treated in the hydrogen atmosphere at above 1100° C. for more than 1 minute, and the LSTD density up to the surface layer 5 µm is made below 1 piece/cm², and the BMD density is made not below 7×10⁴ pieces/cm², the Grown-in defect of the surface layer of the silicon wafer, LSTD density up to the surface layer 5 µm can be surely made below 1 piece/cm², and the BMD density can be made not below 7×10⁴ pieces/cm², and the aging dielectric breakdown characteristic of the oxide film of the semiconductor device is not deteriorated, and also in the semiconductor device production process, the yield can be increased, and the IG effect can be sufficiently obtained, and the OSF by the heavy metal contamination is not generated, and the oxide film withstand voltage characteristic of the silicon wafer can be increased. Further, because the thermal treatment time period is a short time, there also be no heavy metal contamination from the thermal treatment furnace.

What is claimed is:

1. A method of fabricating a silicon single crystal ingot, characterized in that, in a method of fabricating a silicon single crystal ingot using the Czochralski method, a pulling up process of the silicon single crystal ingot by which the silicon single crystal ingot is pulled up from a silicon fused liquid in which nitrogen and carbon are doped in silicon so that a nitrogen density of a pulled up silicon single crystal ingot is $1\times10^{13}$–$5\times10^{15}$ atoms/cm³, and carbon density is $5\times10^{15}$–$3\times10^{16}$ atoms/cm³, is included.

2. A method of fabricating a silicon single crystal ingot according to claim 1, wherein the silicon fused liquid in which nitrogen and carbon are doped in silicon, is made in such a manner that a carbon plate is arranged above the silicon fused liquid and fused.

3. The method of fabricating the silicon wafer according to claim 2, wherein the pulling up process is a process to pull up the silicon single crystal ingot so that the nitrogen density of the silicon single crystal ingot is $1\times10^{13}$–$5\times10^{15}$ atoms/cm³, and the carbon density is $5\times10^{15}$–$3\times10^{16}$ atoms/cm³.

4. The method of fabricating the silicon wafer according to claim 1, wherein the pulling up process is a pulling up process to be conducted at the pulling up speed of 1.0–1.8 mm/minute.

5. A method of fabricating a silicon wafer, characterized in that: a pulling up process in which a silicon single crystal ingot having a nitrogen density of $1\times10^{13}$–$5\times10^{15}$ atoms/cm³, and carbon density of $5\times10^{15}$–$3\times10^{16}$ atoms/cm³ is pulled up from a silicon fused liquid in which nitrogen and carbon are doped in silicon, by using the Czochralski method; a process in which the pulled up silicon single crystal ingot is sliced and the silicon wafer is produced; and further, a process in which the wafer is heat-treated and a crystal defect having the gettering effect is formed inside, are included.

6. A silicon wafer production method, characterized in that: a process in which a silicon single crystal ingot is formed from a silicon fused liquid in which nitrogen or carbon, or both of nitrogen and carbon are doped in silicon, by using the Czochralski method; a process in which the pulled up silicon single crystal ingot is sliced and the silicon wafer is produced; a process in which the silicon wafer is polished and a specular polished wafer is produced; and an etching process in which the specular polished wafer is etched by using an etching solution, and an etch pit density not below 0.11 µm created on the surface of the specular polished wafer is made not above 2 pieces/cm² and the maximum size of the etch pit is made not above 0.15µm, are included.

7. The method of fabricating the silicon wafer according to claim 6, wherein, in the etching process, a process to heat-treat the etched silicon wafer in a high temperature hydrogen atmosphere, is included.

8. The method of fabricating the silicon wafer according to claim 6, wherein, in the etching process, the composition of the etching solution is a ratio of ammonium 1: hydrogen peroxide 2: water 13, and the liquid temperature is 60–70° C., and the etching time period is 10–30 minutes.

9. The method of fabricating the silicon wafer, characterized in that: the pulling up process in which the silicon single crystal ingot is pulled up from the silicon fused liquid in which nitrogen is doped, by using the Czochralski method; a slice process in which the silicon single crystal ingot is sliced and the silicon wafer is produced; and a process to conduct the hydrogen annealing so that a crystal defect on the surface layer of the silicon wafer is decreased and the BMD density inside the wafer is increased, are included.

10. The method of fabricating the silicon wafer according to claim 9, wherein the pulling up process is a process to pull up the silicon single crystal ingot so that the nitrogen density contained in the crystal of the silicon wafer is $1\times10^{13}$–$5\times10^{15}$ atoms/cm³, and the oxygen density is $0.7\times10^{18}$–$1.4\times10^{18}$ atoms/cm³.

11. The method of fabricating the silicon wafer according to claim 10, wherein the pulling up process is a pulling up process to be conducted at the pulling up speed of 1.0–1.8 mm/minute.

12. The method of fabricating the silicon wafer according to claim 9, wherein the process to conduct the hydrogen annealing includes a process to anneal the wafer at the temperature range of 1000–1400° C. for not below 10 minutes.

13. The method of fabricating the silicon wafer according to claim 9, wherein the process to conduct the hydrogen annealing is a process to heat-treat the silicon wafer so that the COP of the surface layer 0.2 µm of the silicon wafer is not above 3 pieces per wafer.

14. The method of fabricating the silicon wafer according to claim 9, wherein the process to conduct the hydrogen annealing is a process to heat-treat the silicon wafer so that the LSTD density not below the dimension 70 nm of not above 3 pieces/cm² exists in the area of the surface layer 0 to 5 µm of the hydrogen annealed silicon wafer, and in the area of not below 10 µm, the BMD not below the dimension of 70 nm exists in the high density.

15. The method of fabricating the silicon wafer according to claim 13, wherein the process to conduct the hydrogen annealing includes a process to anneal the wafer so that the BMD density of the hydrogen annealed silicon wafer is not below $0.5\times10^5$/cm².

16. The method of fabricating the silicon wafer, characterized in that a process to pull up the silicon single crystal ingot from the silicon fused liquid in which the nitrogen is doped, by using the Czochralski method, and a slice process to produce the silicon wafer by slicing the pulled up silicon single crystal ingot, are included, and the pulling up process is a process to pull up the ingot so that the silicon wafer nitrogen density is $6\times10^{13}$–$2\times10^{15}$ atoms/cm³, and the oxygen density is $0.8\times10^{18}$–$1.2\times10^{18}$ atoms/cm³.

17. The method of fabricating the silicon wafer according to claim 16, wherein a process to heat-treat the silicon wafer so that the LSTD density up to the surface layer 5 µm is not above 1 piece/cm², and the BMD density in the area not below the depth of 10 µm is $7\times10^4$ pieces/cm², in the atmosphere of $H_2$, Ar, $N_2$, or inert gas, reduction gas, or mixed gas of them, at not below 1100° C. for not below 1 minute, is included.

18. The method of fabricating the silicon wafer according to claim 17, wherein the heat treatment process is conducted in the hydrogen atmosphere.

19. The method of fabricating the silicon wafer according to claim 16, wherein the pulling up process is a pulling up process to be conducted at the pulling up speed of 1.0–1.8 mm/minute.

* * * * *